United States Patent
Flanagan et al.

(10) Patent No.: US 12,362,137 B2
(45) Date of Patent: Jul. 15, 2025

(54) AUTOMATED SAMPLE ALIGNMENT FOR MICROSCOPY

(71) Applicant: FEI Company, Hillsboro, OR (US)

(72) Inventors: John Flanagan, Hillsboro, OR (US); Michael Strauss, Hllsboro, OR (US)

(73) Assignee: FEI Company, Hillsboro, OR (US)

( * ) Notice: Subject to any disclaimer, the term of this patent is extended or adjusted under 35 U.S.C. 154(b) by 410 days.

(21) Appl. No.: 17/810,860

(22) Filed: Jul. 6, 2022

(65) Prior Publication Data
US 2023/0020742 A1     Jan. 19, 2023

Related U.S. Application Data

(60) Provisional application No. 63/218,715, filed on Jul. 6, 2021.

(51) Int. Cl.
*H01J 37/26*     (2006.01)

(52) U.S. Cl.
CPC ... *H01J 37/268* (2013.01); *H01J 2237/20207* (2013.01); *H01J 2237/20214* (2013.01)

(58) Field of Classification Search
CPC .......... H01J 37/268; H01J 2237/20207; H01J 2237/20214; H01J 37/265; G06T 7/168; G06T 2207/10061; G06T 2207/20084; G01N 23/225; G01N 2223/3306; G01N 2223/401
See application file for complete search history.

(56) References Cited

U.S. PATENT DOCUMENTS

| | | | | |
|---|---|---|---|---|
| 6,067,164 | A * | 5/2000 | Onoguchi | H01J 37/28 250/311 |
| 10,037,866 | B2 * | 7/2018 | Enyama | H01J 37/21 |
| 10,551,326 | B2 * | 2/2020 | Kang | G01N 21/9501 |
| 10,866,094 | B2 * | 12/2020 | Liu | B82Y 35/00 |
| 10,937,625 | B2 * | 3/2021 | Franken | H01J 37/26 |
| 2019/0333199 | A1 * | 10/2019 | Ozcan | G06T 5/70 |
| 2020/0064549 | A1 * | 2/2020 | Nishina | G06N 3/088 |
| 2020/0168433 | A1 * | 5/2020 | Franken | H01J 37/28 |
| 2021/0384021 | A1 * | 12/2021 | Ovchinnikova | G16C 20/20 |
| 2022/0012906 | A1 * | 1/2022 | Yano | G06T 7/62 |
| 2022/0277427 | A1 * | 9/2022 | Bromberg | H01J 37/222 |
| 2023/0020742 | A1 * | 1/2023 | Flanagan | H01J 37/268 |
| 2023/0144331 | A1 * | 5/2023 | Wang | H01L 21/67288 356/451 |
| 2023/0360190 | A1 * | 11/2023 | Kitao | G06T 7/12 |
| 2024/0202882 | A1 * | 6/2024 | Park | G06F 17/17 |
| 2024/0257901 | A1 * | 8/2024 | Yano | G16C 20/30 |

* cited by examiner

*Primary Examiner* — David A Vanore
(74) *Attorney, Agent, or Firm* — BakerHostetler

(57) ABSTRACT

Systems and methods for automated sample alignment for microscopy are described herein. In one aspect a method can include: rotating the sample along a first axis by each of a plurality of rotation angles; imaging, with a charged particle beam, the sample for each rotation angle; and determining a first rotation angle based on the image for each rotation angle, wherein the first rotation angle aligns the sample to the charged particle beam in relation to the first axis.

20 Claims, 11 Drawing Sheets

AUTOMATED SAMPLE ALIGNMENT FOR MICROSCOPY

CROSS REFERENCE TO RELATED APPLICATIONS

This application claims priority to U.S. Provisional Patent Application No. 63/218,715 filed on Jul. 6, 2021, entitled "Automated Sample Alignment for Microscopy". The above-referenced application is incorporated herein by reference in its entirety for any and all purposes.

TECHNICAL FIELD

The present disclosure relates to the field of microscopy and to metrology of microscopic systems. The present disclosure further relates to a method for aligning a sample in a microscopy system. More particularly, the present disclosure relates to a method for automatic determination of the tilt angles of the sample for optimal alignment for metrology.

BACKGROUND

The rapid digital transformation currently underway has brought on an ever-increasing demand for more components to be packed into devices. This ever-increasing demand has led to development of 3-dimensional micro and nano structures on chips, to improve capacity and performance with a smaller increase in size. For example, one such device can comprise 3-dimensional NAND memory. In conventional 2-dimensional memory comprising cells, the cells are arranged in a planar fashion on a base of the memory. In 3-dimensional memory however, cells can be stacked on top of each other allowing a larger number of cells to be placed on the base. Microscopy systems can typically then be used to observe, or characterize, these devices. Such microscopy systems can typically use a charged particle beam that offers higher resolution than a photon beam.

A typical process for observing these devices under a charged particle beam can comprise placing the device (sample) onto a sample holder of the microscopy system and aligning the sample such that the plane of the sample is significantly orthogonal to the charged particle beam. The alignment can comprise a translation to bring the sample under the charged particle beam at a desired location and/or an out of plane rotation to align the sample such that the direction of stacking (of a 3-dimensional structure) is significantly parallel to the direction of the charged particle beam. The optimal alignment can then comprise determining the angles of rotation about a pair of orthogonal axes that lie in the plane of the sample mutually orthogonal to the beam.

In order to determine these angles, typically, a sweep is made through one of the angles (e.g., alpha angle) while keeping the other fixed, and the angle for which the edges of the structures on the sample appear maximally sharp in an image of the sample is chosen as the optimal angle. Then, a second sweep can be carried out for the other angle (e.g., beta angle), and the optimal angle be determined similarly. Sweeping over both of the angles can be time-consuming and can lead to inefficiency. Additionally, if the initial configuration of the angles is too far off the optimal values, reaching the optimal configuration can take an unnecessarily large amount of time to reach the optimal angles.

SUMMARY

Embodiments of the present disclosure aim to improve the efficiency of determining the optimal orientation by determining the optimal second angle of rotation based on the optimal value of the first rotation angle. Thus, a second sweep (e.g., for the beta angle) can not be required. Further, embodiments of the present disclosure also aim to reduce the number of sweeps needed to determine the optimal value of the first rotation angle by providing a method to determine the optimal value of the first rotation angle using additional information other than just a sharpness in each of the collected images of the sample. In some cases, this process can include using an orientation of the power spectrum of the collected images.

The present disclosure provides improvements in aligning a sample in a microscopy system. The processes described herein seeks to overcome or at least alleviate the shortcomings and disadvantages of the prior art. More particularly, it is an object of the present disclosure to provide an improved method, system and computer program product for optimal, automatic alignment of a sample in a microscopy system.

In a first aspect, the present disclosure relates to a method for aligning a sample in a microscopy system, where the method includes: rotating the sample along a first axis by each of a plurality of rotation angles; imaging, with a charged particle beam, the sample for each rotation angle; and determining a first rotation angle based on the image for each rotation angle, where the first rotation angle aligns the sample to the charged particle beam in relation to the first axis.

In some cases, the first rotation angle can be determined using a sharpness of at least a part of the image. For example, the sample can include structures with edges and can be aligned such that the edges are parallel to the charged particle beam. In this case, the sharpness of the edge in images of the sample can be used to determine the optimal orientation where, for example, the edge appears the sharpest.

In some cases, the first rotation angle can be determined by calculating a power spectrum of the image for each rotation angle, and determining an orientation of the power spectrum for each rotation angle.

In some cases, the first rotation angle can be determined by calculating a power spectrum of the image for each rotation angle, and determining an anisotropy of the power spectrum for each rotation angle. The power spectrum can be maximally isotropic for the optimal rotation. Thus, by sweeping over different rotations, the rotation for which the power spectrum is maximally isotropic can be determined.

In some cases, the sample can include a base and at least one cell arranged on the base. The base can be significantly planar, i.e., with a thickness less than a length and a width, and the at least one cell can be arranged on the plane containing the length and the width. In some cases, the sample can include a plurality of cells arranged on the base. In some cases, each cell can comprise a plurality of layers.

The microscopy system can be configured to direct a beam of particles at the sample. The beam of particles can be used to image the sample. The particles in the beam can interact with the particles in the sample resulting in emissions including electrons, ions, or photons.

The method as described above can include aligning the sample such that the top surface of any of the cells in the sample is significantly perpendicular to the beam of particles. An angle between the beam of particles and a normal to the top surface of any of the cells can be between 0° and 50° (e.g., between 0° and 15°).

The method can further include determining a second rotation angle based on the first rotation angle, where the second rotation angle aligns the sample to the charged particle beam in relation to a second axis, where the second axis is orthogonal to the first axis. The two axes of rotation can include any pair of orthogonal axes lying in a plane normal to the charged particle beam.

In some cases, the first axis of rotation can be significantly parallel to one of the length or width of the base of the sample and the second axis of rotation can be significantly parallel to the other of the length or width of the base of the sample. So, for example, the first axis of rotation can be parallel to the length of the base of the sample, in which case the second axis of rotation can be parallel to the width of the base of the sample. However, embodiments of the present disclosure can rely on any two orthogonal axes of rotation and the axes need not be parallel to either the length or the width of the base of the sample.

The method as described above can further include using a principal component decomposition of the power spectrum of the image to determine the orientation of the power spectrum. The principal component decomposition can facilitate determining of an orientation of an ellipse that can be fitted to the power spectrum, whose tilt can then determine the direction in which the power spectrum is oriented.

The method can further include selecting a plurality of principal components of the power spectrum to determine an orientation of the power spectrum.

The plurality of principal components can include a subset (e.g., two) of the components with the largest eigenvalues. The eigenvalues can then represent the major and minor axes of the ellipse that best describe the power spectrum.

In some cases, the ellipticity of the power spectrum can be determined based on the ratio of the larger of the two principal components to the smaller of the two principal components. The larger of the principal components may include the principal component with the larger eigenvalue. The ratio can then indicate an ellipticity of the distribution of the power spectrum. The more anisotropic the power spectrum, the larger the ellipticity would be. Thus, an isotropic power spectrum would have an ellipticity close to 1. The orientation of the ellipse can be determined by the arctangent of the two largest principal components.

The second rotation angle can be determined based on the orientation of the power spectrum. As described further below, the orientation of the power spectrum can be used to relate the first rotation angle and the second rotation angle, thus allowing determination of one given the other.

In some cases, each of the plurality of rotation angles can be between −50° and +50° (e.g., 5°, 10°, 15°, and the like).

In some cases, the plurality of rotation angles can include a list of angles. For example, such a list can comprise the angles −5°, 0°, and +5° and the sample can be rotated by each of these angles in turn about the first axis of rotation. Such a method can allow using arbitrary values for the angles of rotation.

In some cases, the plurality of rotation angles can include a minimum angle, a differential angle, and a number of angles. For example, the list above can be equivalently described as the minimum angle −5°, the differential angle +5°, and the number of angles 3, e.g., the list includes a total of 3 values.

In some cases, the plurality of rotation angles can include a minimum angle, a differential angle, and a maximum angle. For example, the list above can be equivalently described as the minimum angle −5°, the differential angle +5°, and the maximum angle +5°.

In some cases, the plurality of rotation angles can include 3 rotation angles. However, the plurality of rotation angles can include any number of rotation angles >=2.

In some cases, the sample can include a polycrystalline material or any other non-crystalline material.

In some cases, directing the beam of particles at the sample can result in an interaction of the particles with the sample.

In some cases, imaging the sample can include detecting emissions arising from the interaction of the particles with the sample. The emissions can include backscattered electrons, ions, photons, or transmitted electrons, ions, or photons.

The microscopy system can include at least one detector configured to detect emissions arising from the interaction of the particles with the sample. In some cases, the detector can include a detector for detecting backscattered particles or for detecting transmitted particles. In some cases, the detector can be further configured to generate an image of the sample including a 2-dimensional map of values corresponding to the probability of detecting emissions at each point on the 2-dimensional map.

In some cases, calculating the power spectrum of the image can include Fourier transforming the 2-dimensional map.

The method can further include segmenting the image of the sample to extract images of the cells. This segmenting can facilitate reducing the time taken in computing the power spectrum, as well as reducing signal coming from edges of the sample that do not correspond to cells and thus cannot carry information useful in determining a tilt of the sample. This can also reduce features, not of interest, from negatively impacting the alignment of the cells.

In some cases, the segmentation of the image can be, at least in part, a manual segmentation. This can simply include labeling regions of the image that can be visually identified as cells, for example. In some cases, the segmentation of the image can be, at least in part, an automatic segmentation. In some cases, the segmentation of the image can be, at least in part, carried out by a machine learning algorithm. In some cases, input to the machine learning algorithm can include an image of the sample and an output of the machine learning algorithm can include regions identified as cells. In some cases, the machine learning algorithm can be a supervised algorithm trained on images of samples with labels on the regions comprising cells. For this purpose, a set of images can be manually labeled, for example. in some case, the set of images can be automatically labeled based on locations in the images that include cells, in case the cells are arranged in a definite pattern. Further, it can be of advantage for the set of images to include images taken at a plurality of different tilt angles so as to allow robust determination of cells in images at different angles. The plurality of angles can include a range of angles extending beyond the range of plurality of angles described above (e.g., −15° to +15°). The images can further include images taken by varying the angle of rotation about both the first axis and the second axis.

In some cases, the machine learning algorithm can include a neural network, or a fully or regional convolutional neural network.

In some cases, the power spectrum of the image can include a power spectrum over regions of the image identified as cells.

In some cases, the charged particles in the charged particle beam can include ions. Alternatively, the charged particles can include electrons. Thus, the microscopy system can include any of a Transmission Electron Microscope (TEM), Scanning TEM, Scanning Electron Microscope (SEM), or Focused Ion Beam Microscope (FIB). However, this list should not be construed to be exhaustive and an embodiment of the method as described here can be carried out using any suitable microscopy system.

In some cases, the charged particles in the beam can be accelerated by a potential difference between 300 V and 1000 kV.

In some cases, the sample can include a 3D flash memory sample having at least one cell. In some cases, the cell can include a memory cell. In some cases, the memory cell can include a NAND memory cell.

In another aspect of the disclosure, a microscopy system can include a sample, where the microscopy system is configured to: rotate the sample along a first axis by each of a plurality of rotation angles; image, with a charged particle beam, the sample for each rotation angle; and determine a first rotation angle based on the image for each rotation angle, where the first rotation angle aligns the sample to the charged particle beam in relation to the first axis.

In some cases, the microscopy system can be further configured to determine a second rotation angle based on the first rotation angle, where the second rotation angle aligns the sample to the charged particle beam in relation to a second axis, and where the second axis is orthogonal to the first axis.

In some cases, the microscopy system can include a sample holder configured to hold the sample. In some cases, the sample holder can include a tilt mechanism configured to allow the sample to be tilted along at least one axis of rotation.

In some cases, the sample can include a base and at least one cell arranged on the base. In some cases, the sample can include a plurality of cells arranged on the base. In some cases, each cell can include a plurality of layers.

The microscopy system can be further configured to direct a beam of particles at the sample. In some cases, directing the beam can include focusing it. In some cases, directing the beam of particles at the sample can result in an interaction of the particles with the sample.

In some cases, imaging the sample can include detecting emissions arising from the interaction of the particles with the sample.

In some case, the microscopy system can include at least one detector configured to detect emissions arising from the interaction of the particles with the sample.

In some cases, the microscopy system can further include a data processing unit. In some cases, the data processing unit can include a memory configured to store an image of the sample. In some cases, the image can be stored to allow performing a Fourier transform to determine the power spectrum as described above.

The microscopy system can include a control unit configured to at least control a tilt of the sample. The tilt can be controlled by controlling a tilt of the stage, for example. Further. controlling the tilt can correspond to rotating the sample by a defined angle about a defined axis of rotation. The control unit can be further configured to control other components of the microscopy system such as the direction of the charged particle beam, or the positioning of any of the detectors of the microscopy system.

The data processing unit as described above can be further configured to at least send data to the control unit. In some cases, the data can include a plurality of rotation angles corresponding to a rotation about the first axis. In some cases, the data can further include at least one rotation angle corresponding to a rotation about the second axis.

The microscopy system as described above can be configured to perform the method of aligning a sample as described above.

In a third aspect, the present disclosure relates to a computer program product including instructions, when run on a data processing unit of a system according to any of the preceding system embodiments, to perform the method of aligning a sample according to any of the preceding method embodiments. In some cases, the computer program product can include a machine learning algorithm.

In some cases, the computer program product can include instructions to calculate the power spectrum of a 2-dimensional image, the instructions including conducting a Fourier transform on the 2-dimensional image.

The computer program product can be configured to be used together with as described above, where the computer program product can in some cases include instructions to determine the cell locations on the base.

BRIEF DESCRIPTION OF THE DRAWINGS

In the drawings, which are not necessarily drawn to scale, like numerals can describe similar components in different views. Like numerals having different letter suffixes can represent different instances of similar components. The drawings illustrate generally, by way of example, but not by way of limitation, various aspects discussed in the present document. In the drawings.

DETAILED DESCRIPTION OF ILLUSTRATIVE EMBODIMENTS

Figure 1:
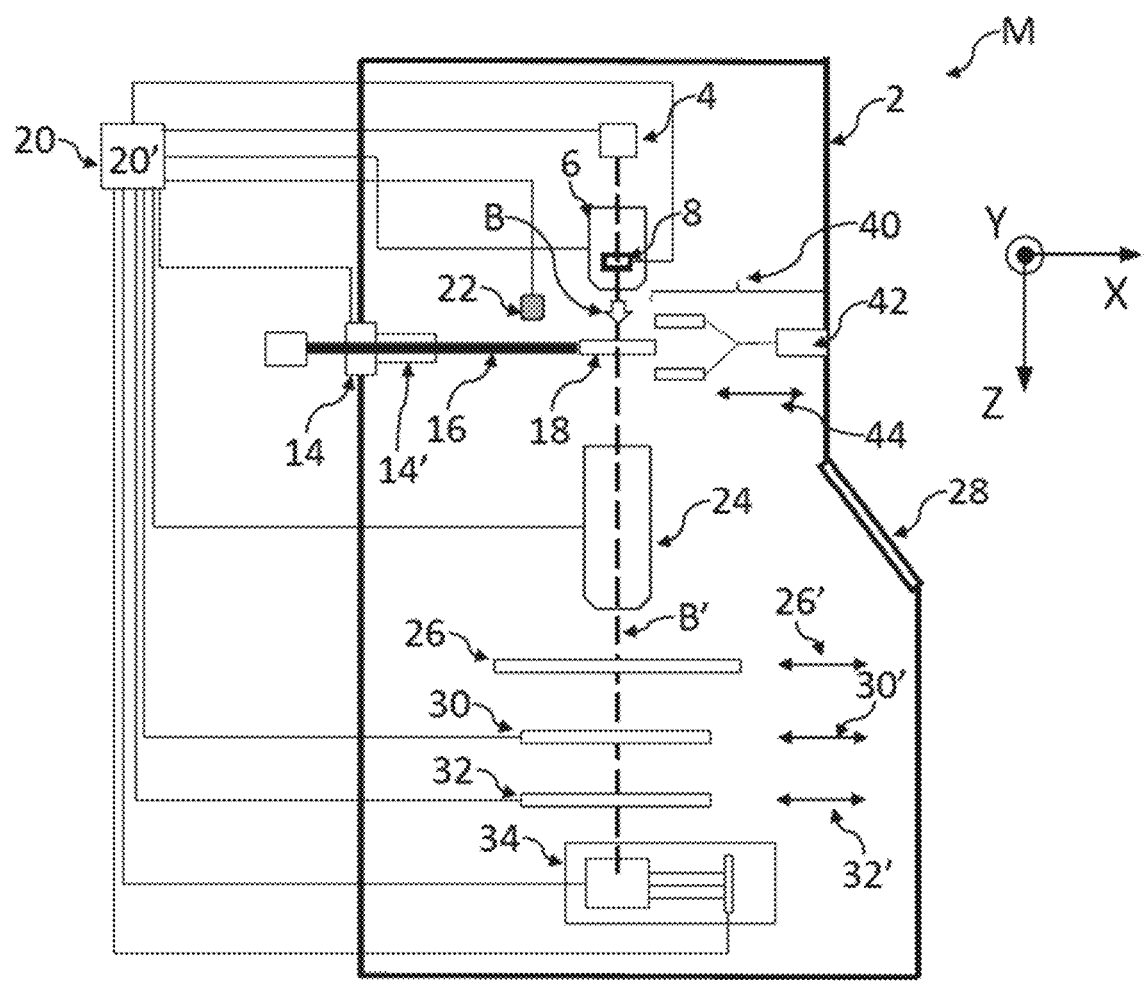
FIG. 1 depicts a microscopy system according to embodiments of the present disclosure.

The present disclosure may be understood more readily by reference to the following detailed description of desired embodiments and the examples included therein.

Unless otherwise defined, all technical and scientific terms used herein have the same meaning as commonly understood by one of ordinary skill in the art. In case of conflict, the present document, including definitions, will control. Preferred methods and materials are described below, although methods and materials similar or equivalent to those described herein can be used in practice or testing. All publications, patent applications, patents and other references mentioned herein are incorporated by reference in their entirety. The materials, methods, and examples disclosed herein are illustrative only and not intended to be limiting.

The singular forms "a," "an," and "the" include plural referents unless the context clearly dictates otherwise.

As used in the specification and in the claims, the term "comprising" can include the embodiments "consisting of" and "consisting essentially of." The terms "comprise(s)," "include(s)," "having," "has," "can," "contain(s)," and variants thereof, as used herein, are intended to be open-ended transitional phrases, terms, or words that require the presence of the named ingredients/steps and permit the presence of other ingredients/steps. However, such description should be construed as also describing compositions or processes as "consisting of" and "consisting essentially of" the enumerated ingredients/steps, which allows the presence of only the named ingredients/steps, along with any impurities that might result therefrom, and excludes other ingredients/steps.

As used herein, the terms "about" and "at or about" mean that the amount or value in question can be the value designated some other value approximately or about the same. It is generally understood, as used herein, that it is the nominal value indicated ±10% variation unless otherwise indicated or inferred. The term is intended to convey that similar values promote equivalent results or effects recited in the claims. That is, it is understood that amounts, sizes, formulations, parameters, and other quantities and characteristics are not and need not be exact, but can be approximate and/or larger or smaller, as desired, reflecting tolerances, conversion factors, rounding off, measurement error and the like, and other factors known to those of skill in the art. In general, an amount, size, formulation, parameter or other quantity or characteristic is "about" or "approximate" whether or not expressly stated to be such. It is understood that where "about" is used before a quantitative value, the parameter also includes the specific quantitative value itself, unless specifically stated otherwise.

Unless indicated to the contrary, the numerical values should be understood to include numerical values which are the same when reduced to the same number of significant figures and numerical values which differ from the stated value by less than the experimental error of conventional measurement technique of the type described in the present application to determine the value.

All ranges disclosed herein are inclusive of the recited endpoint and independently of the endpoints. The endpoints of the ranges and any values disclosed herein are not limited to the precise range or value; they are sufficiently imprecise to include values approximating these ranges and/or values.

As used herein, approximating language can be applied to modify any quantitative representation that can vary without resulting in a change in the basic function to which it is related. Accordingly, a value modified by a term or terms, such as "about" and "substantially," may not be limited to the precise value specified, in some cases. In at least some instances, the approximating language can correspond to the precision of an instrument for measuring the value. The modifier "about" should also be considered as disclosing the range defined by the absolute values of the two endpoints. For example, the expression "from about 2 to about 4" also discloses the range "from 2 to 4." The term "about" can refer to plus or minus 10% of the indicated number. For example, "about 10%" can indicate a range of 9% to 11%, and "about 1" can mean from 0.9-1.1. Other meanings of "about" can be apparent from the context, such as rounding off, so, for example "about 1" can also mean from 0.5 to 1.4. Further, the term "comprising" should be understood as having its open-ended meaning of "including," but the term also includes the closed meaning of the term "consisting." For example, a composition that comprises components A and B can be a composition that includes A, B, and other components, but can also be a composition made of A and B only. Any documents cited herein are incorporated by reference in their entireties for any and all purposes.

Figures

FIG. 1 depicts a microscopy system M, particularly a charged particle microscopy system M, configured to use a charged particle beam B to observe and/or characterize a sample 18. The charged particle beam B can be electrons or ions. Additionally, the microscopy system M depicted in FIG. 1 can include a transmission-type microscopy system M, wherein an image of the sample 18 is taken using the emissions in the transmission region of the microscopy system M. Thus, M can represent a Transmission Electron Microscope (TEM) or a Scanning Transmission Electron Microscope (STEM). In the Figure, within a vacuum enclosure 2, an charged particle source 4 produces the beam B of charged particles that propagates along a particle-optical axis B' and traverses an particle-optical illuminator 6, serving to direct/focus the charged particles onto a chosen part of the sample 18 (which can, for example, be (locally) thinned/planarized).

Also depicted is a deflector 8, which (inter alia) can be used to effect scanning motion of the beam B. The sample 18 can be held on a sample holder 16 that can be positioned in multiple degrees of freedom by a positioning device/stage 14, which moves a cradle 14' into which holder 16 is (removably) affixed; for example, the sample holder 16 can include a finger that can be moved (inter alia) in the XY plane (see the depicted Cartesian coordinate system; typically, motion parallel to Z and tilt about X/Y can also be possible). Such movement allows different parts of the sample 18 to be illuminated/imaged/inspected by the charged particle beam B traveling along axis B' (in the Z direction) (and/or allows scanning motion to be performed, as an alternative to beam scanning). If desired, an optional cooling device (not depicted) can be brought into intimate thermal contact with the sample holder 16, so as to maintain the sample holder 16 (and the sample 18 thereupon) at cryogenic temperatures, for example.

The charged particle beam B can interact with the sample 18 in such a manner as to cause various types of "stimulated" radiation to emanate from the sample 18, including (for example) secondary electrons, backscattered electrons, X-rays and optical radiation (cathodoluminescence). If desired, one or more of these radiation types can be detected with the aid of analysis device 22, which can be a combined scintillator/photomultiplier or EDX (Energy-Dispersive X-Ray Spectroscopy) module, for instance; in such a case, an image can be constructed using a similar principle as in a Scanning Electron Microscope (SEM). However, alternatively or supplementally, one can study charged particles that traverse (pass through) the sample 18, exit/emanate from it and continue to propagate (substantially, though generally with some deflection/scattering) along axis B'.

Such a transmitted charged particle flux can enter an imaging system (projection lens) 24, which can include a variety of electrostatic/magnetic lenses, deflectors, correctors (such as stigmators), etc. In normal (non-scanning) TEM mode, this imaging system 24 can focus the transmitted electron flux onto a fluorescent screen 26, which, if desired, can be retracted/withdrawn (as schematically indicated by arrows 26') so as to move the fluorescent screen 26 out of the way of axis B'. An image (or diffractogram) of the sample 18 can be formed by imaging system 24 on screen 26, and this can be viewed through viewing port 28 located in a suitable part of a wall of enclosure 2. The retraction mechanism for screen 26 can, for example, be mechanical and/or electrical in nature, and is not depicted here. As an alternative to viewing an image on screen 26, one can instead make use of the fact that the depth of focus of the electron flux leaving imaging system 24 is generally quite large (e.g. of the order of 1 meter). Consequently, various other types of analysis apparatus can be used downstream of screen 26, such as a TEM camera 30. At camera 30, the electron flux can form a static image (or diffractogram) that can be processed by controller/processor 20 and displayed on a display device (not depicted), such as a flat panel display, for example. When not required, camera 30 can be retracted/withdrawn (as schematically indicated by arrows 30') so as to move the camera 30 out of the way of axis B'.

The analysis apparatus can further include a STEM detector 32. An output from detector 32 can be recorded as a function of (X,Y) scanning position of the beam B on the sample 18, and an image can be constructed that is a "map" of output from detector 32 as a function of X,Y. Detector 32 can include a single pixel with a diameter of e.g. 20 mm, as opposed to the matrix of pixels characteristically present in camera 30. Moreover, detector 32 can in some cases include a lower acquisition rate than camera 30. Once again, when not required, detector 32 can be retracted/withdrawn (as schematically indicated by arrows 32') so as to move the detector 32 out of the way of axis B' (although such retraction may not be required in the case of a donut-shaped annular dark field detector 32, for example; in such a camera, a central hole can allow flux passage when the camera was not in use).

As an alternative to imaging via items 30 or 32, one can also use spectroscopic apparatus 34, which could be an EELS module, for example. It should be noted that the order/location of items 30, 32 and 34 is not strict, and many possible variations are conceivable. For example, spectroscopic apparatus 34 can also be integrated into the imaging system 24.

The controller (e.g., computer processor) 20 is connected to various illustrated components via control lines (buses) 20'. The controller 20 can provide a variety of functions, such as synchronizing actions, providing setpoints, processing signals, performing calculations, and displaying messages/information on a display device (not depicted). The controller 20 can be (partially) inside or outside the enclosure 2, and can have a unitary or composite structure, as desired.

The microscope M can further comprise a retractable X-ray CT module 40, which can be advanced/withdrawn with the aid of positioning system 42 so as to place it on/remove it from the path of the beam B (see arrow 44). In the particular configuration illustrated here, the module 40 comprises a fork-like frame on which are mounted—a target above the plane of the sample 18, and an X-ray detector below the plane of the sample 18.

Embodiments of the disclosure herein relate to the stage 14, and in particular, to the tilting mechanism of the stage 14 that allows the sample 18 to be tilted. The tilting movement that can be characterized by a plurality of angles, for example two angles corresponding to tilts about two orthogonal axes lying in the plane of the sample 18, can be of particular relevance for metrology applications. For example, when the sample 18 includes 3D NAND memory cells, which include a plurality of layers stacked on top of each other, the microscope system M can be used to characterize the dimensions of the memory cells. This can be of significance in determining performance characteristics of the cells, such as a transmission latency, or to ensure that requisite specifications can be met. In such applications, it can be advantageous to align the sample 18 such that the charged particle beam B is normal to the plane of the sample 18, or equivalently, to the plane of the memory cells.

As described above, a typical method for determining the correct tilt angles, or rotation angles, about two orthogonal axes ($\alpha$ and $\beta$), can include rotating the sample 18 along $\alpha$, then rotating the sample 18 along $\beta$, imaging the sample 18 for each orientation, and determining the orientation for which one or more edge(s) of the sample 18 is viewed the sharpest. Identifying the image, and thus the orientation, for which the edge(s) are the sharpest can be done, at least in part, manually or with the help of an algorithm. When done algorithmically, it can include using an edge finding algorithm on each of the images, and determining the image for which the edge slope is maximal. The optimal angle can be computed by interpolating an optimal value between two or more images at various tilts. This procedure can be done for one or both tilt axes ($\alpha$ and $\beta$).

Figure 5:
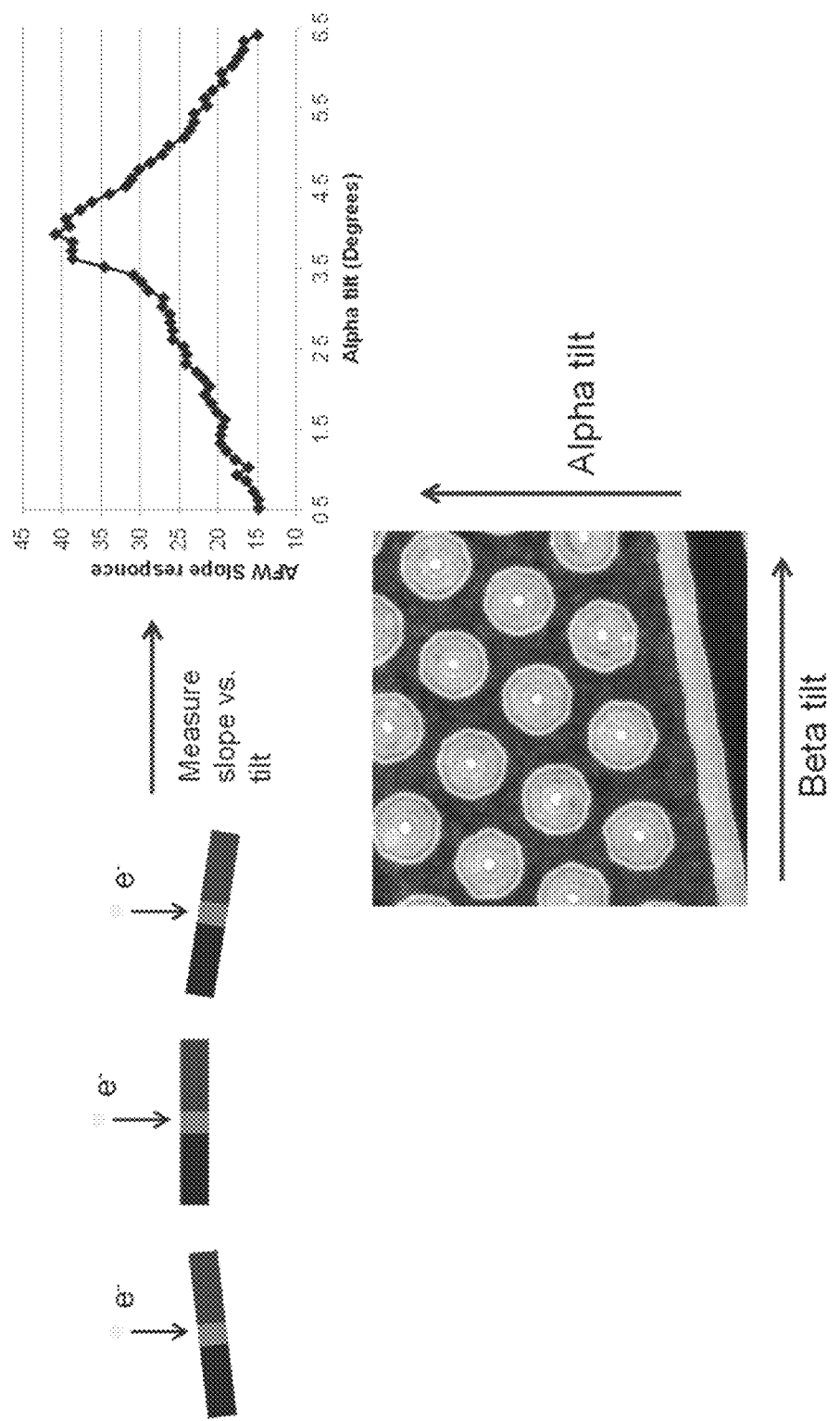
FIG. 5 depicts a conventional process for aligning a sample in a microscopy system.

For example, a typical process to identify the optimal orientation can include sweeping through multiple values of only one of the angles, say $\alpha$, in a neighborhood of the expected optimal value, while keeping the other angle $\beta$ fixed, and identifying a value of $\alpha$ for which the edges appear maximally sharp. Once this optimal $\alpha$ has been identified, a similar sweep can be made over the other tilt angle, $\beta$, until the edges appear maximally sharp to determine its optimal value (FIG. 5). As described above, this can make the alignment process time-consuming and inefficient.

Figure 4:
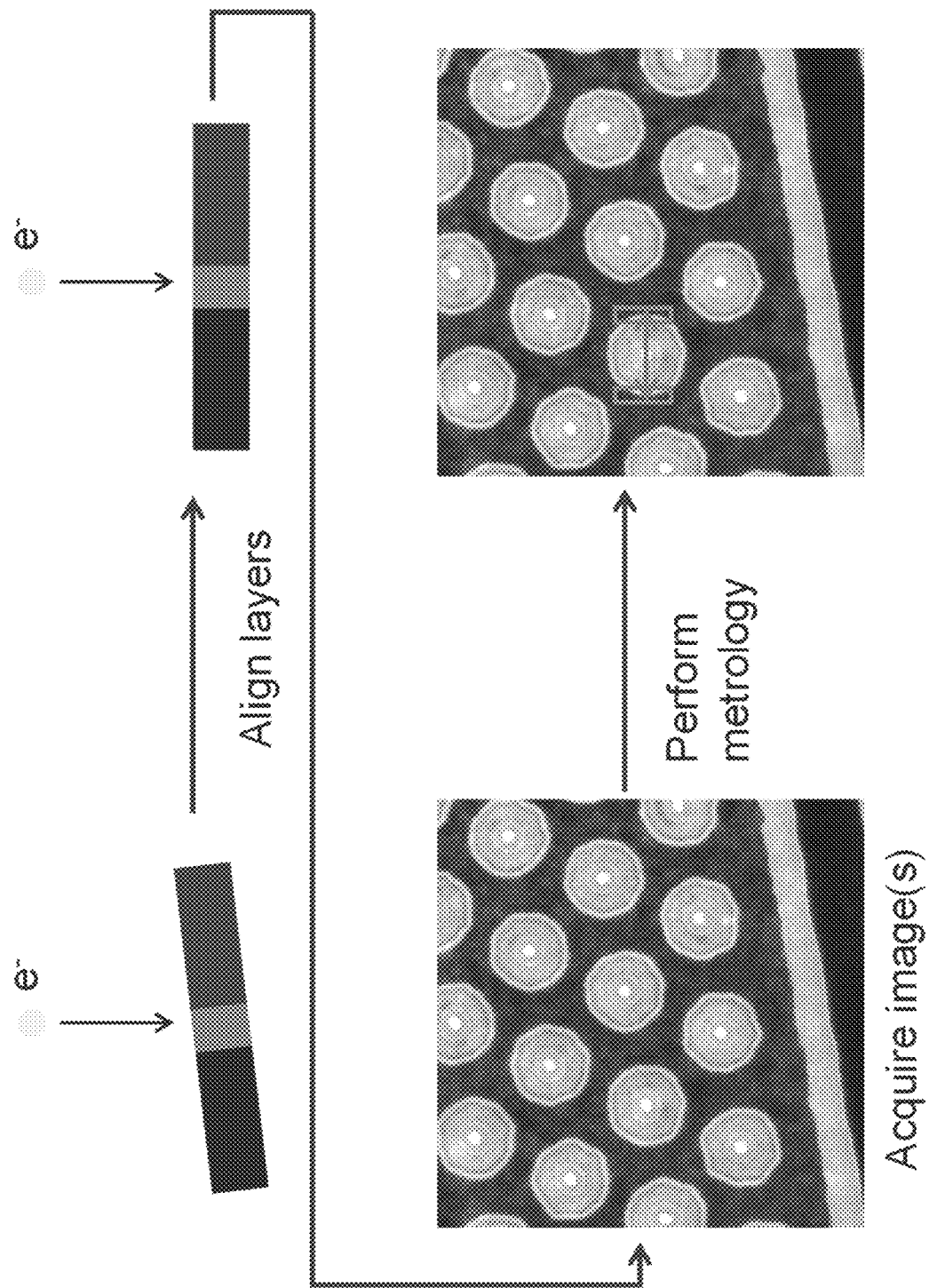
FIG. 4 depicts a process for aligning a sample and performing metrology with a microscopy system according to an embodiment of the present disclosure.

Embodiments of the present disclosure aim to provide a method to make the alignment process more efficient. This can be achieved, for example, by obtaining a mathematical relationship between the angles $\alpha$ and $\beta$, and at least one feature that can be measured from the image of the sample 18. Once such a relationship has been obtained, sweeping can occur over only one of the angles $\alpha$ and $\beta$ (by changing a corresponding angle of the stage 14, for example), while keeping the other fixed, measure the at least one feature from the image of the sample 18 for each value of the angle being swept, and apply the obtained mathematical relationship to then determine the other angle $\beta$. Knowing the value of the angles at which the stage 14 is tilted can then allow for determining the optimal angles by which to tilt the stage 14 to align the sample 18 normal to the primary beam B. Thus, only one angle can need to be swept over, improving the efficiency of the alignment process (FIG. 4). Further details of this procedure are now described with respect to the remaining figures.

Figure 2:
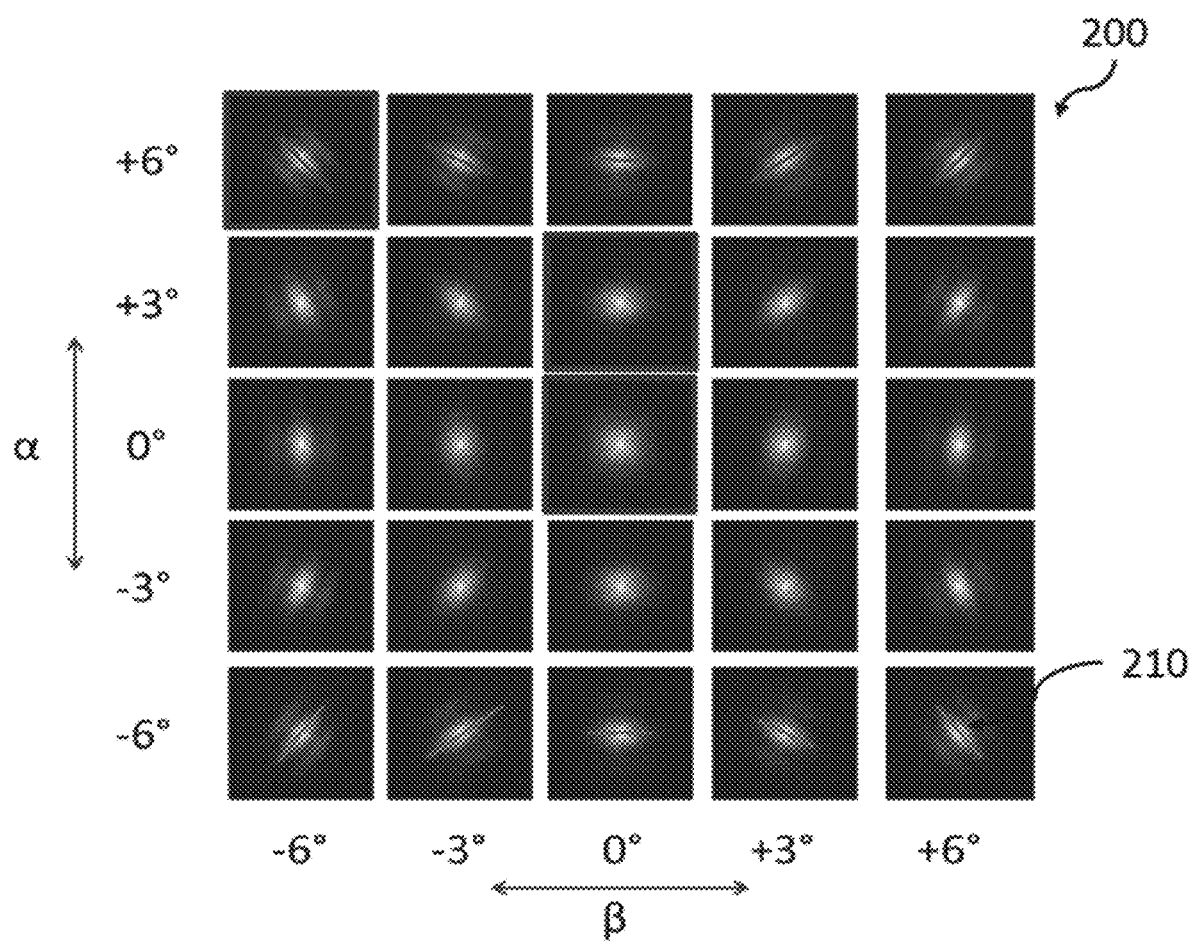
FIG. 2 depicts images of power spectra of sample images according to an embodiment of the present disclosure.

FIG. 2 depicts measurements of a power spectra 200 according to an embodiment of the present disclosure. The power spectra correspond to images of a sample 18 that includes 3D NAND memory cells arranged on a base of the sample 18, for varying angles of rotation about a first axis ($\alpha$), and about a second axis orthogonal to the first axis ($\beta$).

More particularly, FIG. 2 depicts measurements of the power spectra over regions of images identified as the memory cells. Power spectra 200 can be computed from the images by first Fourier transforming the images, which results in a 2-dimensional distribution of complex numbers comprising amplitudes and phases, that can represent contributions of different frequencies of variation (of the brightness, for example) along the 2 dimensions, and then taking the square of the absolute value at each point of the 2-dimensional distribution.

As described above, each of the 3D NAND memory cells can include a plurality of layers stacked on top of each other. Images of the sample can include contributions both from cells and regions of the base of sample 18 exposed to the beam B during imaging. These regions can not provide useful information on the orientation of the (memory) cells and thus the optimal orientation of the sample 18. Thus, instead of taking the power spectrum 200 over the whole image, regions (corresponding to pixels, or sets of pixels) of the image corresponding to cells can be first identified (that can be called a segmentation of the image) and a power spectrum 200 can be calculated for these regions. This can help reduce noise coming from the non-cell regions of the image. If the sample 18 is oriented optimally, such that the beam B is normal to the plane of the sample 18, the power spectrum 200 is expected to be significantly isotropic. On the other hand, for a sub-optimal orientation, where the beam B is not orthogonal to the plane of sample 108, the power spectrum 200 is expected to be anisotropic.

The segmentation of images to find the individual cells can be carried out (partly or completely) manually, or using a computer-implemented algorithm. In some cases, the computer-implemented algorithm can include a machine learning algorithm, for example. The machine learning algorithm can include a neural network, more particularly, a convolutional neural network. The convolutional neural network can be fully convolutional, regional, or any other type capable of identifying individual structures. The machine learning algorithm can be first trained on a set of labelled images, where the regions corresponding to cells have been labelled. Once trained, images can simply be input to the algorithm and an output of the algorithm can include the image with regions identified as cells, for example, a list of bounding boxes (with locations of pixels representing the 4 corners, for example) corresponding to regions of the image identified as cells.

Once segmentation is completed, the power spectrum 200 over the cells can be computed. A computer-implemented algorithm can also be provided to compute the power spectrum 200. Such an algorithm can include, for example, a Fast Fourier Transform algorithm.

For the example depicted in FIG. 2, the angles $\alpha$ and $\beta$ can be varied symmetrically from −6° to +6°, by varying the tilt of the stage 14', for example. An orientation 210 of the power spectrum 200 is also indicated by a line in the first and last rows of panels in FIG. 2. As the angle $\beta$ is varied, keeping $\alpha$ constant, the orientation 210 of the corresponding power spectrum 200 is seen to vary systematically. The orientation 210 can vary similarly systematically as the angle $\alpha$ is varied, keeping $\beta$ constant. Thus, a relation can be obtained between the tilt angles of the stage 14' and the orientation 210 of the corresponding power spectrum 200. FIG. 2 also demonstrates that when the tilt angles $\alpha$ and $\beta$ are close to their optimal values (close to 0° for each in this example), the power spectrum 200 is significantly isotropic. For values far away from these optimal values, the power spectrum 200 becomes anisotropic.

The behavior of the power spectrum 200 described above can be succinctly captured in the following equation, that can be derived by projecting an ideal parallelepiped rectangle along an axis corresponding to the direction of the beam B $$\theta_{maxSlope} = \operatorname{atan}\left(\frac{\sin(\beta - \beta_{stage})\cos(\alpha - \alpha_{stage})}{\sin(\alpha - \alpha_{stage})}\right) \quad (1)$$

where $\alpha - \alpha_{stage}$ and $\beta - \beta_{stage}$ are the tilt angles of the sample 18 with respect to the stage 14. $\alpha$ and $\beta$ can be the alignment values. $\theta_{maxSlope}$ provides a measure of the orientation 210 of the power spectrum 200. For the given example, $\theta_{maxSlope}$ is determined by first decomposing the 2-dimensional power spectrum 200 into its principal components. This can be accomplished, for example, by diagonalizing the weighted matrix representing the distribution of the power spectrum 200. Then, a plurality of the principal components can be chosen to describe the orientation 210 of the power spectrum 200. In the present example, the two components with the largest eigenvalues can be chosen and the ratio of the larger of the chosen eigenvalues to the smaller was calculated. This ratio is equal to the tangent of $\theta_{maxSlope}$ and represents a direction where the slope of the power spectrum 200 is a maximum.

The optimal tilt angles, $\alpha$ and $\beta$, can be determined based on Equation (1). So, for example, the process for determining $\alpha$ and $\beta$ can include varying the tilt of the stage corresponding to $\alpha_{stage}$, while keeping $\beta_{stage}$ fixed. A plurality of rotation angles, (e.g., 3 rotation angles), can be chosen for $\alpha_{stage}$. The angles can be equally spaced, or can be any 3 rotation angles appropriately chosen.

For each value of $\alpha_{stage}$, an image of the sample 18 can be obtained, the regions including cells identified, and a power spectrum 200 over the cells computed. The principal components of the power spectrum can then be obtained and the angle $\theta_{maxSlope}$ calculated. First a can be taken as $-\alpha_{stage}$ for the image with minimal anisotropy. $\alpha$ can be refined by interpolating with images from neighboring tilts using, for example, a parabola. Next, by fitting the measured values of $\theta_{maxSlope}$ as a function of the measured values of $\alpha_{stage}$ using equation (1), the angle $\beta$ can be determined. Using the so-determined $\beta$, the stage can be tilted to $\beta + \beta_{stage}$ and $-\alpha$. Thus, by sweeping over the tilt or rotation angle along one axis (corresponding to $\alpha$), the optimal angle along the other orthogonal axis, $\beta_{optimal}$, can be obtained, without having to perform a second sweep. In other embodiments, both $\alpha$ and $\beta$ can be obtained by fitting equation (1) direction to $\theta_{maxSlope}$ as a function of $\alpha_{stage}$.

In some cases, the segmentation of the images of the sample 18 into regions containing cells can be omitted. Similarly, it can also be possible to determine a direction of maximum slope using the images themselves, with the help of edge finders for example, and a power spectrum 200 may not be calculated. Or, some other parameter can be measured from the images and related to the tilt angles $\alpha$ and $\beta$. For example, a slope of an edge in the sample 18 can be measured by considering the projection of the sample 18 (and thus the edge) with a particular tilt angle $\alpha$ and $\beta$ along the direction of the charged particle beam B. Such a projection would allow the tilt angles of the sample 18 to be related to features measurable from the images.

Figure 3:
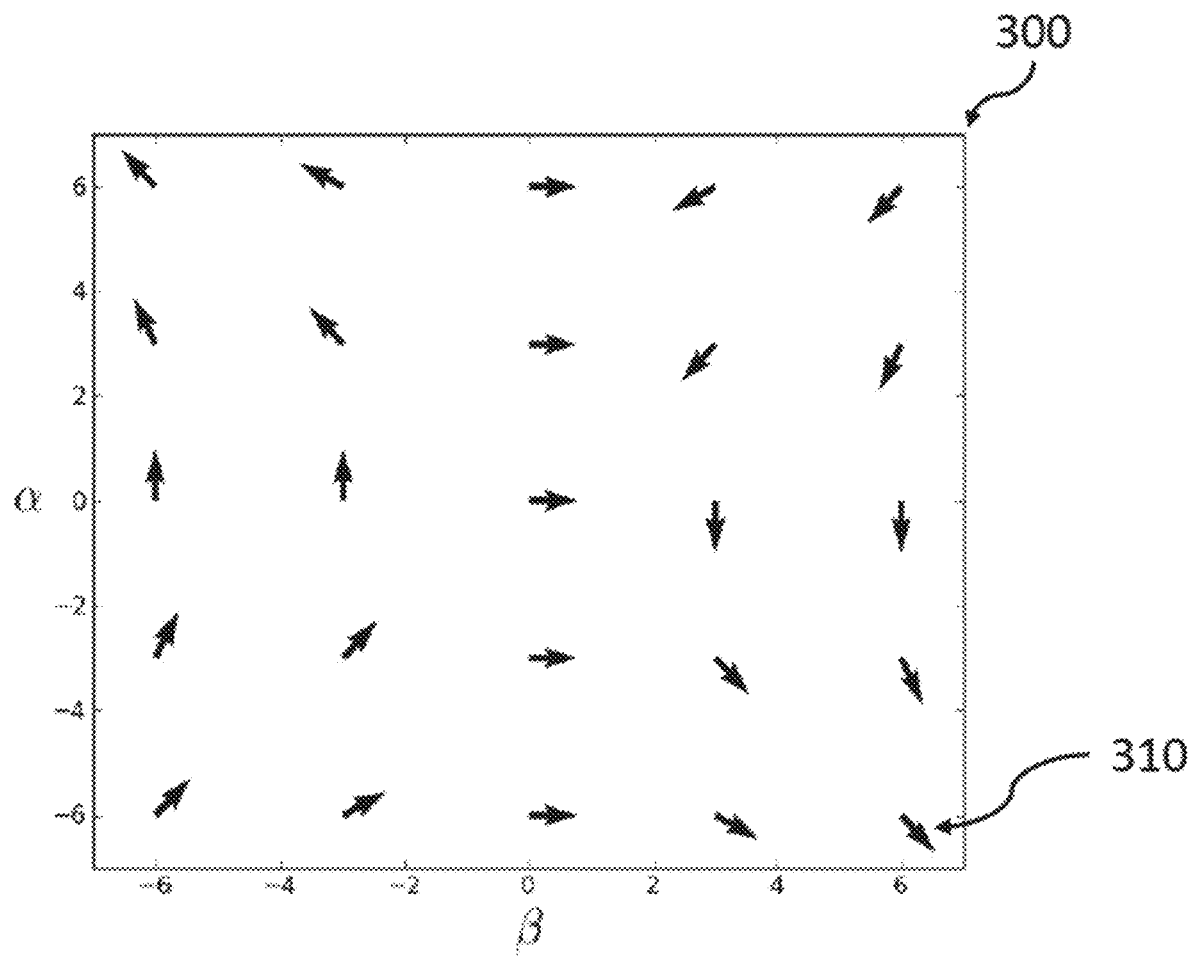
FIG. 3 depicts a vector field corresponding to images of the power spectra of sample images according to an embodiment of the present disclosure.

FIG. 3 depicts a vector field of the direction of the maximum slope 310 of the power spectrum 300 as predicted by equation (1) as a function of the angles $\alpha$ and $\beta$. The angles α and β are chosen to vary over the same ranges as depicted in FIG. 2, (e.g., −6° to +6°). The predicted orientation 310 depicted in FIG. 3 substantially matches the measured orientation 210 depicted in FIG. 2. Differences can arise however, owing to profile filtering, rough non-planar edges, and variations in the geometry of the sample 18, among other things. However, overall, the measurements substantially match with the predictions.

Overall, embodiments of the present disclosure thus allow a sample to be aligned in a microscopy system in a fast, reliable, and reproducible manner.

Whenever a relative term, such as "about", "substantially" or "approximately" is used in this specification, such a term should also be construed to also include the exact term. That is, e.g., "substantially straight" should be construed to also include "(exactly) straight".

Whenever steps were recited in the above or also in the appended claims, it should be noted that the order in which the steps are recited in this text can be accidental. That is, unless otherwise specified or unless clear to the skilled person, the order in which steps are recited can be accidental. That is, when the present document states, e.g., that a method comprises steps (A) and (B), this does not necessarily mean that step (A) precedes step (B), but it is also possible that step (A) is performed (at least partly) simultaneously with step (B) or that step (B) precedes step (A). Furthermore, when a step (X) is said to precede another step (Z), this does not imply that there is no step between steps (X) and (Z). That is, step (X) preceding step (Z) encompasses the situation that step (X) is performed directly before step (Z), but also the situation that (X) is performed before one or more steps (Y1), . . . , followed by step (Z). Corresponding considerations apply when terms like "after" or "before" are used.

While in the above, a preferred embodiment has been described with reference to the accompanying drawings, the skilled person will understand that this embodiment was provided for illustrative purpose only and should by no means be construed to limit the scope of the present invention, which is defined by the claims.

EXEMPLARY EMBODIMENTS

Below, method embodiments will be discussed. These embodiments are abbreviated by the letter M followed by a number. Whenever reference is herein made to method embodiments, these embodiments are meant.

M1. A method for aligning a sample in a microscopy system, wherein the method comprises: rotating the sample along a first axis by each of a plurality of rotation angles; imaging, with a charged particle beam, the sample for each rotation angle; and determining a first rotation angle based on the image for each rotation angle, wherein the first rotation angle aligns the sample to the charged particle beam in relation to the first axis.

M2. The method according to the preceding embodiment, wherein the first rotation angle is determined using a sharpness of at least a part of the image.

M3. The method according to the any of the preceding embodiments, wherein the first rotation angle is determined by: calculating a power spectrum of the image for each rotation angle; and determining an orientation of the power spectrum for each rotation angle.

M4. The method according to the any of the preceding embodiments, wherein the first rotation angle is determined by: calculating a power spectrum of the image for each rotation angle; and determining an anisotropy of the power spectrum for each rotation angle.

M5. The method according to any of the preceding embodiments, wherein the sample comprises a base and at least one cell arranged on the base.

M6. The method according to the preceding embodiment, wherein the sample comprises a plurality of cells arranged on the base.

M7. The method according to any of the 2 preceding embodiments, wherein each cell comprises a plurality of layers.

M8. The method according to any of the preceding embodiments, wherein the microscopy system is configured to direct a beam of particles at the sample.

M9. The method according to the preceding embodiment and with the features of embodiment M5, wherein the method comprises aligning the sample such that the top surface of any of the cells in the sample is significantly perpendicular to the beam of particles.

M10. The method according to the preceding embodiment, wherein an angle between the beam of particles and a normal to the top surface of any of the cells is between 0° and 50°.

M11. The method according to any of the preceding embodiments, wherein the method comprises determining a second rotation angle based on the first rotation angle, wherein the second rotation angle aligns the sample to the charged particle beam in relation to a second axis, the second axis orthogonal to the first axis.

M12. The method according to the preceding embodiment and with the features of embodiment M5, wherein the first axis of rotation comprises an axis of rotation significantly parallel to one of the length or width of the base of the sample and a second axis of rotation significantly parallel to the other of the length or width of the base of the sample.

M13. The method according to any of the preceding embodiments and with the features of embodiment M3, wherein the method further comprises using a principal component decomposition of the power spectrum of the image to determine the orientation of the power spectrum.

M14. The method according to the preceding embodiment, wherein the method further comprises choosing a plurality of principal components of the power spectrum to determine an orientation of the power spectrum.

M15. The method according to the preceding embodiment, wherein the plurality of principal components comprises two components with the largest eigenvalues.

M16. The method according to the preceding embodiment, wherein the orientation and ellipticity of the power spectrum is determined based on the ratio of the two principal components.

M17. The method according to any of the preceding embodiments and with the features of embodiments M3 and M11, wherein the second rotation angle is determined based on the orientation of the power spectrum.

M18. The method according to any of the preceding embodiments, wherein each of the plurality of rotation angles is between −50° and +50° (e.g., −15° and +15°).

M19. The method according to any of the preceding embodiments, wherein the plurality of rotation angles comprises a list of angles.

M20. The method according to any of the preceding embodiments, wherein the plurality of rotation angles comprises a minimum angle, a differential angle, and a number of angles.

M21. The method according to any of the preceding embodiments, wherein the plurality of rotation angles comprises a minimum angle, a differential angle, and a maximum angle.

M22. The method according to any of the preceding embodiments, wherein the plurality of rotation angles comprises three rotation angles.

M23. The method according to any of the preceding embodiments, wherein the sample comprises a polycrystalline material or any other non-crystalline material M24. The method according to any of the preceding embodiments and with the features of embodiment M8, wherein directing the beam of particles at the sample results in an interaction of the particles with the sample.

M25. The method according to the preceding embodiment, wherein imaging the sample comprises detecting emissions arising from the interaction of the beam of particles with the sample.

M26. The method according to the preceding embodiment, wherein the microscopy system comprises at least one detector configured to detect emissions arising from the interaction of the particles with the sample.

M27. The method according to the preceding embodiment, wherein the detector is further configured to generate an image of the sample comprising a 2-dimensional map of values corresponding to a probability of detecting emissions at each point on the 2-dimensional map.

M28. The method according to the preceding embodiment, wherein calculating the power spectrum of the image comprises Fourier transforming the 2-dimensional map.

M29. The method according to any of the preceding embodiments and with the features of embodiment M5, wherein the method further comprises segmenting the image of the sample to extract images of the cells.

M30. The method according to the preceding embodiment, wherein the segmentation of the image is, at least in part, a manual segmentation.

M31. The method according to any of the 2 preceding embodiments, wherein the segmentation of the image is, at least in part, an automatic segmentation.

M32. The method according to any of the 3 preceding embodiments, wherein the segmentation of the image is, at least in part, carried out by a machine learning algorithm.

M33. The method according to the preceding embodiment, wherein an input to the machine learning algorithm comprises an image of the sample and an output of the machine learning algorithm comprises regions identified as cells.

M34. The method according to any of the 2 preceding embodiments, wherein the machine learning algorithm is a supervised algorithm trained on images of samples with labels on the regions comprising cells.

M35. The method according to any of the preceding embodiments and with the features of the embodiment M32, wherein the machine learning algorithm comprises a neural network, preferably, a fully or regional convolutional neural network.

M36. The method according to any of the preceding embodiments and with the features of embodiments M3, and M33, wherein the power spectrum of the image comprises a power spectrum only over regions of the image identified as cells.

M37. The method according to any of the preceding embodiments, wherein the charged particles comprise ions.

M38. The method according to the any of preceding embodiments but without the features of the preceding embodiment, wherein the charged particles comprise electrons.

M39. The method according to any of the preceding embodiments, wherein the charged particles in the beam are accelerated by a potential difference between 300 V and 1000 kV.

M40. The method according to any of the preceding embodiments, wherein the sample comprises a 3D flash memory sample.

M41. The method according to the preceding embodiment and with the features of embodiment M5, wherein the cell comprises a memory cell.

M42. The method according to the preceding embodiment, wherein the memory cell comprises a NAND memory cell.

Below, system embodiments will be discussed. These embodiments are abbreviated by the letter S followed by a number.

S1. A microscopy system comprising a sample, wherein the microscopy system is configured to: rotate the sample along a first axis by each of a plurality of rotation angles; image, with a charged particle beam, the sample for each rotation angle; and determine a first rotation angle based on the image for each rotation angle, wherein the first rotation angle aligns the sample to the charged particle beam in relation to the first axis.

S2. The microscopy system according to the preceding embodiment, wherein the microscopy system is configured to determine a second rotation angle based on the first rotation angle, wherein the second rotation angle aligns the sample to the charged particle beam in relation to a second axis, the second axis orthogonal to the first axis S3. The microscopy system according to the preceding embodiment, wherein the microscopy system comprises a sample holder configured to hold the sample.

S4. The microscopy system according to the preceding embodiment, wherein the sample holder comprises a tilt mechanism configured to allow the sample to be tilted along at least two axes of rotation.

S5. The microscopy system according to any of the preceding system embodiments, wherein the sample comprises a base and at least one cell arranged on the base.

S6. The microscopy system according to the preceding embodiment, wherein the sample comprises a plurality of cells arranged on the base.

S7. The microscopy system according to any of the two preceding embodiments, wherein each cell comprises a plurality of layers.

S8. The microscopy system according to any of the preceding system embodiments, wherein the microscopy system is configured to direct a beam of particles at the sample.

S9. The microscopy system according to the preceding embodiment, wherein directing the beam comprises focusing it.

S10. The microscopy system according to any of the two preceding embodiments, wherein directing the beam of particles at the sample results in an interaction of the particles with the sample.

S11. The microscopy system according to the preceding embodiment, wherein imaging the sample comprises detecting emissions arising from the interaction of the particles with the sample.

S12. The microscopy system according to the preceding embodiment, wherein the microscopy system comprises at least one detector configured to detect emissions arising from the interaction of the particles with the sample.

S13. The microscopy system according to any of the preceding system embodiments, wherein the microscopy system further comprises a data processing unit.

S14. The microscopy system according to the preceding embodiment, wherein the data processing unit comprises a memory configured to store an image of the sample.

S15. The microscopy system according to any of the preceding system embodiments, wherein the microscopy system comprises a control unit configured to at least control a tilt of the sample.

S16. The microscopy system according to the preceding embodiment and with the features of embodiment S13, wherein the data processing unit is further configured to at least send data to the control unit.

S17. The microscopy system according to the preceding embodiment, wherein the data comprises a plurality of rotation angles corresponding to a rotation about the first axis.

S18. The microscopy system according to any of the two preceding embodiments, wherein the data comprises at least one rotation angle corresponding to a rotation about the second axis.

S19. The microscopy system according to any of the preceding system embodiments, wherein the microscopy system is configured to perform the method according to any of the preceding method embodiments.

Below, computer program product embodiments will be discussed. These embodiments are abbreviated by the letter P followed by a number.

P1. A computer program product comprising instructions, when executed, cause a processor to perform the method according to any of the preceding method embodiments.

P2. The computer program product according to the preceding embodiment, wherein the computer program product comprises a machine learning algorithm.

P3. The computer program product according to any of the preceding computer program product embodiments, wherein the computer program product comprises instructions that when executed cause a processor to calculate the power spectrum of a 2-dimensional image, the instructions comprising Fourier transforming the 2-dimensional image.

P3. The computer program product according to any of the preceding computer program product embodiments, wherein the computer program product is configured to be used together with a system with the features of system embodiment S4, and wherein the computer program product comprises instructions that when executed cause a processor to determine the cell locations on the base.

ILLUSTRATIVE EXPERIMENTAL EXAMPLE

Introduction

The current CD-STEM auto-orient (AO) and Metrios AutoAlignLayers (AAL) is designed to orient amorphous specimen "layers" to the incident electron beam. The algorithm objective is to make the layer edge parallel to the electron beam, hence making the electron beam normal to the specimen surface, which if this is the customer objective assumes the specimen is shaped such that the layers run parallel to the specimen normal. On the other hand if the customer objective is to orient the edge parallel to the beam the specimen shape may not matter. The current AO incarnations have an issue known as the sawtooth bug. This manifests itself as a dependence of the AAL/AO solution upon the starting angle (FIG. 5). Ideally the AAL/AO orientation solution, provided it is not too far off, should not depend on starting angle; e.g., the plot in FIG. 1 should be flat.

Figure 6:
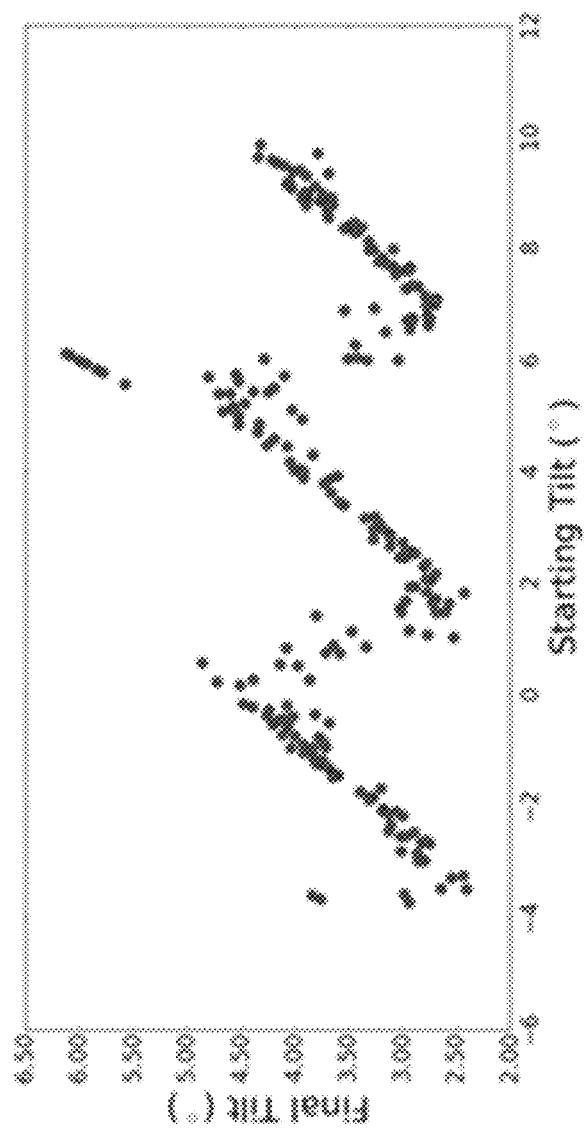
FIG. 6 depicts a graph of starting tilt vs. final tilt for conventional auto align (AO) processes, which highlights the "sawtooth" issue and a dependence of conventional AO solutions on starting tilts of a sample.
Figure 7:
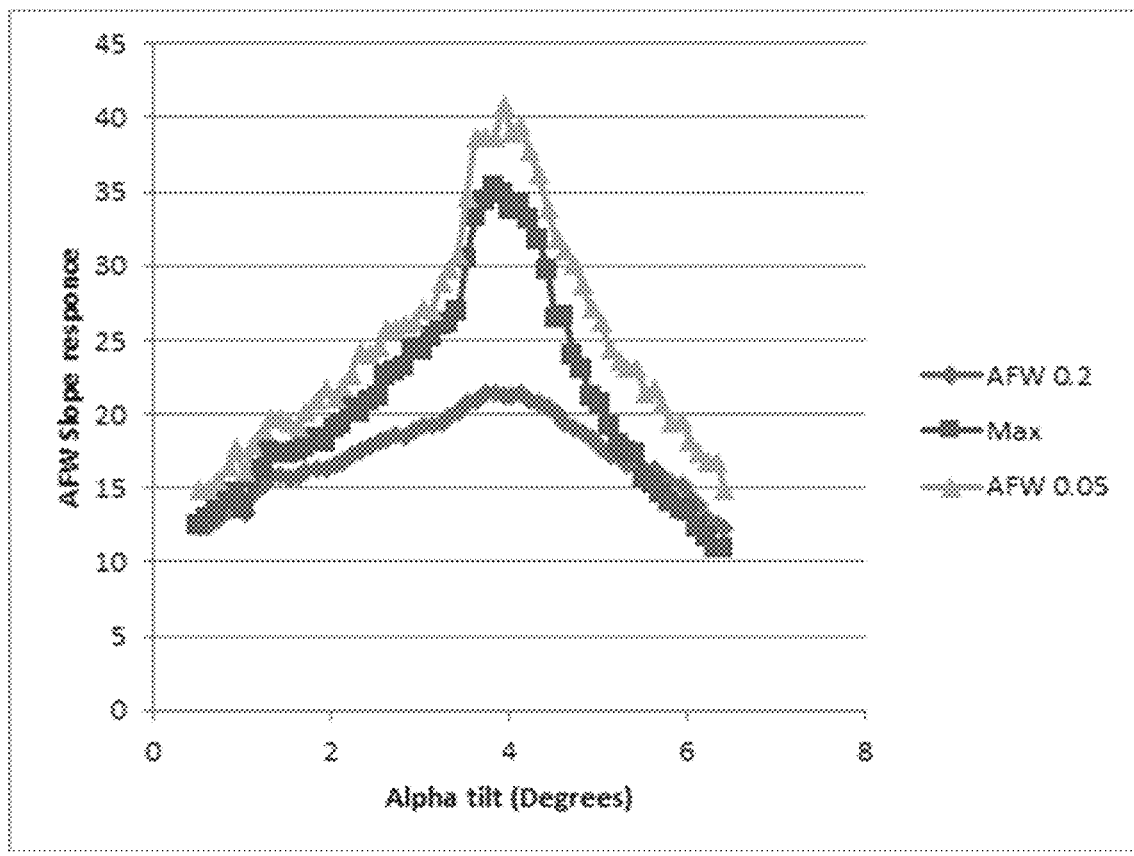
FIG. 7 depicts a graph of alpha tilt vs. slope response for conventional AO or AutoAlignLayer (AAL) processes, which illustrates the plot is not parabolic, thereby affecting the final tilt solution of conventional AO/AAL processes.

The current AO/AAL algorithms tilt the stage in discrete increments computing the edge slope at each stage position. The final, optimal position is determined by fitting a parabola to the points on the curve; the steepest slope along with the one point to the left and right are selected for fitting. It has been previously shown that the plot of slope vs stage tilt is not parabolic (FIG. 6). If a parabola is fitted to such curves the parabola vertex (taken as AAL/AO solution) will depend on which three points are selected (REF). If a moving section window (simulating AAL/AO starting position) is moved over the slope vs. stage tilt plot, and parabola fitted, a sawtooth pattern emerges (FIG. 6). Hence the cause of the sawtooth pattern is the incorrect assumption that the slope vs. stage tilt sweeps a parabola.

A mathematical Model for Slope vs. Stage Tilt

The microscope image can be modeled as the projection of a parallelepiped rectangle down the z axis (if we define the beam as following z). If this parallelepiped rectangle is tilted the parallelepiped rectangle sides in the projection will appear in the image and have an apparent width proportional to the tilt angle and edge direction. The tilt angle depends both on alpha and beta tilt and the profile of the sides we define as edges. The edges will have a slope defined as Equation 2. The grayscale change is simply the difference between the parallelepiped surface and the background support. If the edge is along one tilt direction, the other tilt direction is zero, tilting the parallelepiped will produce edge width inversely proportional to the sine of the tilt angle (Equation 3). Equation 3 produces a curve somewhat similar to FIG. 2 (if one takes the absolute value of Equation 3).

$$\text{Slope} = \Delta\text{Grayscale}/\text{EdgeWidth} \quad (2)$$

$$\text{Slope} = \Delta\text{Grayscale}/(h*\text{Sin}(\alpha)) \quad (3)$$

where h is the parallelepiped height.

Unfortunately Equation 3 does not take into consideration the orientation of the edge with respect to alpha nor the impact of beta mis-tilt. To derive such equations, the parallelepiped is reduced to a plane and tilt this in 3D; however the situation can be further simplified by examining a single vector on this plane. This represents a slice of the edge and can be used to model the relationship of slope to stage tilt. Tilting this vector in 3D can be done by using Euler angles; a rotation along the x axis representing alpha tilt, and a rotation along the y axis representing beta tilt (Equation 4). The actual coordinate system is arbitrary provided alpha and beta tilts are orthogonal.

$$\begin{bmatrix} s_\beta c_\alpha \\ -s_\alpha \\ c_\alpha c_\beta \end{bmatrix} = \begin{bmatrix} 1 & 0 & 0 \\ 0 & c_\alpha & -s_\alpha \\ 0 & s_\alpha & c_\alpha \end{bmatrix} \begin{bmatrix} c_\beta & 0 & s_\beta \\ 0 & 1 & 0 \\ -s_\beta & 0 & c_\beta \end{bmatrix} \begin{bmatrix} 0 \\ 0 \\ 1 \end{bmatrix} \quad (4)$$

Figure 8A:
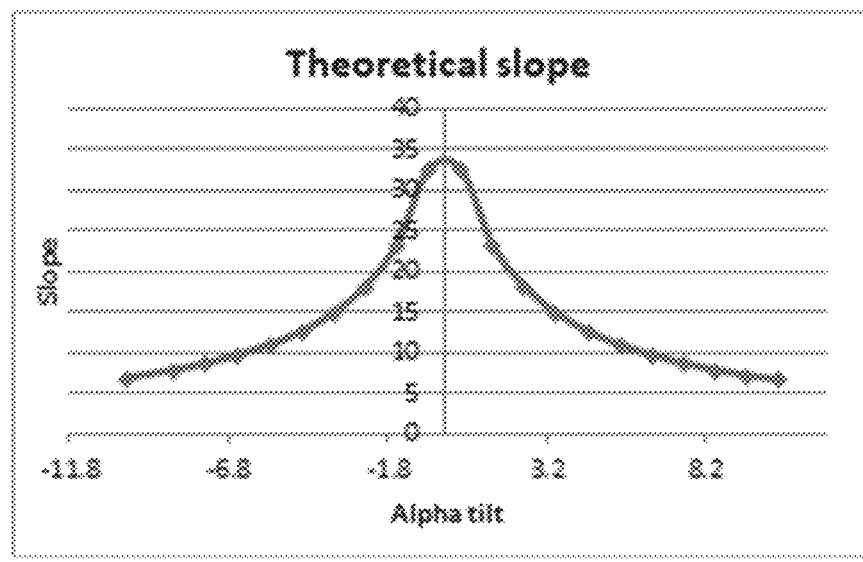
FIG. 8A depicts a graph of theoretical slope.
Figure 8B:
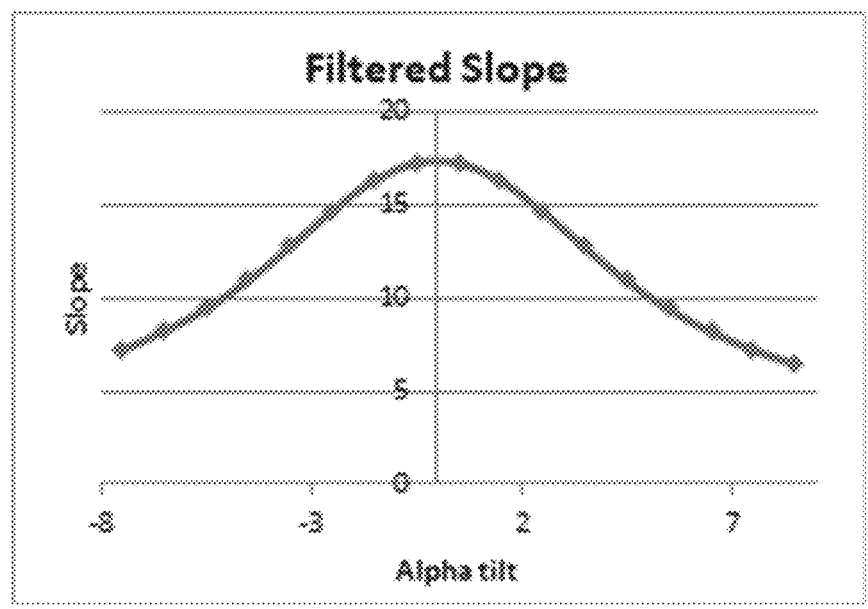
FIG. 8B depicts a graph of a filtered slope for a sample.

If the results of Equation 4 are orthographically projected onto a plane (the image created by a parallel beam) the width of the edge will equal the dot product of the normal unit vector, with respect to the edge, with this projection (Equation 5). In Equation 5, theta is the angle with the direction formed by the alpha and beta tilt; not the angle with alpha or beta tilt axis. Plugging this into Equation 2 and expanding yields the equation for slope as a function of alpha and beta tilt (Equation 6 and 7). FIGS. 8A and 8B show the theoretical curve.

$$EdgeWidth = \cos(\theta)\sqrt{\sin(\beta)^2\cos(\alpha)^2 + \sin(\alpha)^2} \quad (5)$$

$$Slope = scale/\cos(\theta)\sqrt{\sin(\beta)^2\cos(\alpha)^2 + \sin(\alpha)^2} \quad (6)$$

$$scale = \Delta \text{ Grayscale/height} \quad (7)$$

The task remaining is to fit Equation 6 to find alpha and/or beta. Equation 6 is not linear, but can be linearized under the right conditions. Before fitting can be done first note that $\alpha$ and $\beta$ are not the stage tilts, they are orientation mis-tilts and are related to stage tilt by:

$$\begin{cases} \alpha = \alpha_{optimal} + \alpha_{stage} \\ \beta = \beta_{optimal} + \beta_{stage} \end{cases} \quad (8)$$

Equation 6 can be linearized to:

$$\frac{scale^2}{\cos(\theta)^2 slope^2} = C_1 + \cos(2\alpha_{stage})C_2 + \sin(2\alpha_{stage})C_3 \quad (9)$$

Where: $c_1 = \sin(\beta)^2 + 1$; $c_2 = \sin(\beta)^2 \cos(2\alpha_{optimal}) - \cos(2\alpha_{optimal})$; and $c_3 = \sin(2\alpha_{optimal}) - \sin(\beta)^2 \sin(2\alpha_{optimal})$.

If slope is computed as a function of stage alpha tilt, then alpha optimal can be estimated by using Equation 9 as an interpolation function. Note that since only alpha stage is varying then everything else is constant. All the parameters, aside from slope, on the left hand side of the equation can be seen as a constant and simply multiply C1, C2 and C3. Hence three data points are sufficient to fit the data and interpolate (Equation 10). Similar treatment can be done for beta tilt; in Equations 10 and 11 simply replace alpha with beta, while holding alpha constant. In the case of beta the details of coefficients c1-c3 change, but that is not important for interpolation purposes. In principle both alpha and beta could vary, but three data points may be required.

$$\begin{bmatrix} 1 & \cos(2\alpha_{stage1}) & \sin(2\alpha_{stage1}) \\ 1 & \cos(2\alpha_{stage2}) & \sin(2\alpha_{stage2}) \\ 1 & \cos(2\alpha_{stage3}) & \sin(2\alpha_{stage3}) \end{bmatrix} \begin{bmatrix} c_1 \\ c_2 \\ c_3 \end{bmatrix} = \begin{bmatrix} 1/slope_1 \\ 1/slope_2 \\ 1/slope_3 \end{bmatrix} \quad (10)$$

The optimal position can be found by differentiating Equation 9, which is:

$$2\alpha_{optimal} = \operatorname{atan}(c_3/c_2) \quad (11)$$

The interpolation function of Equations 10 and 11 can be utilized rather than a parabola to improve precision and avoid the sawtooth pattern interpolation artifact.

Power Spectrum Analysis

If one looks at disk as a function of alpha tilt holding beta constant the direction of maximum edge width seems to rotate around the disk as alpha is tilted. This effect is also seen in the disk power spectrum; here the edges smear/blur information in the direction normal to the edge. This results in a distortion of the power spectrum. If only disk information is present in the image, the power spectrum is distorted from a disk to an ellipse like object. Previously we attempted to use this information to align disks to the incident beam, however if the disks are too thin the blurring is too small and the algorithm fails. The relationship between power spectrum smear direction and alpha and beta tilt is shown in Equation 12:

$$FFT_{angle} = \operatorname{atan}\left(\frac{\beta_{nominal} - \beta_{alignmnet}}{\alpha_{nominal} - \alpha_{alignmnet}}\right) \quad (12)$$

This equation is empirical. Equation 6 can be re-expressed as Equation 13 to put theta as the angle between beta tilt axis and tilt direction. If one finds the direction (theta) for which the slope is maximum, in Equation 13, an equation very similar to Equation 13 appears (Equation 14).

$$Slope = scale/\sin(\beta)\cos(\alpha)\sin(\theta_b) + \sin(\alpha)\cos(\theta_b) \quad (13)$$

$$\theta_{maxSlope} = \operatorname{atan}\left(\frac{\sin(\beta)\cos(\alpha - \alpha_{stage})}{\sin(\alpha - \alpha_{stage})}\right) \quad (14)$$

Figure 9:
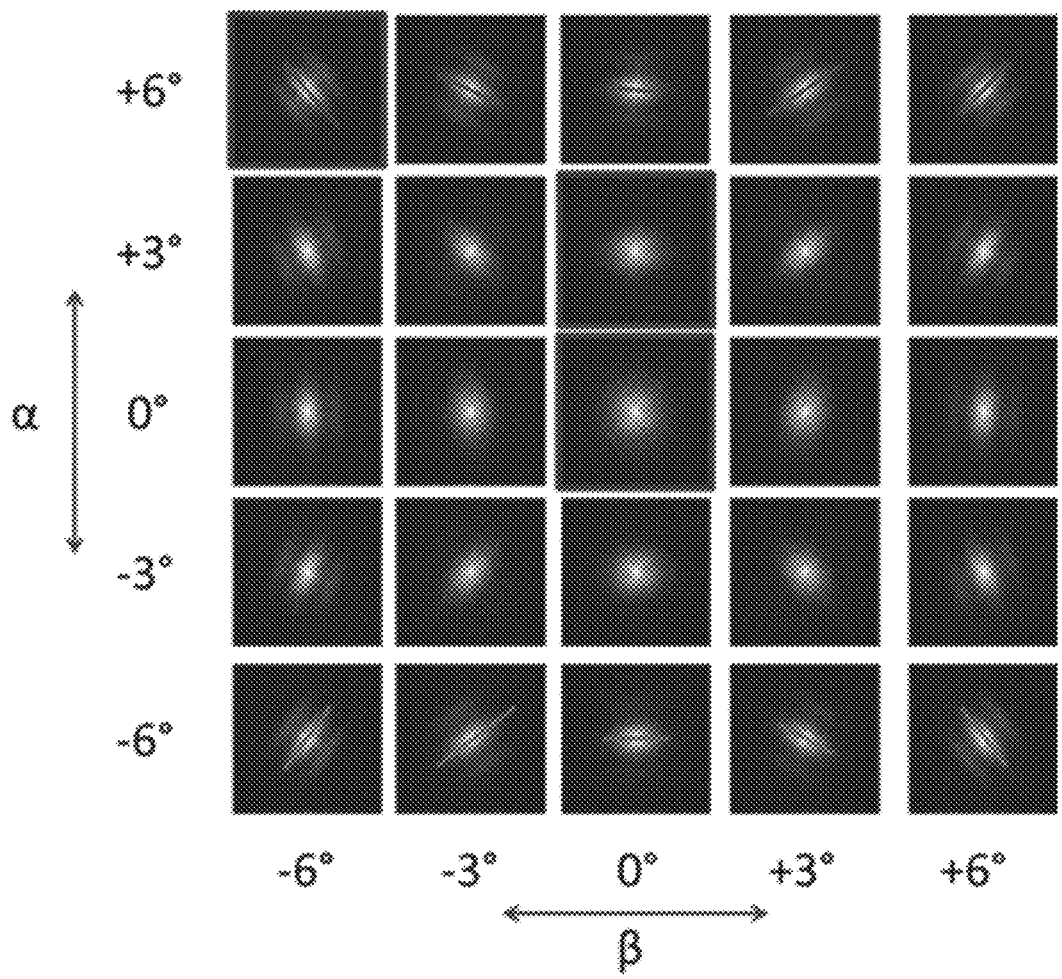
FIG. 9 depicts a power spectrum for disks tilted as a function of alpha and beta tilt.
Figure 10A:
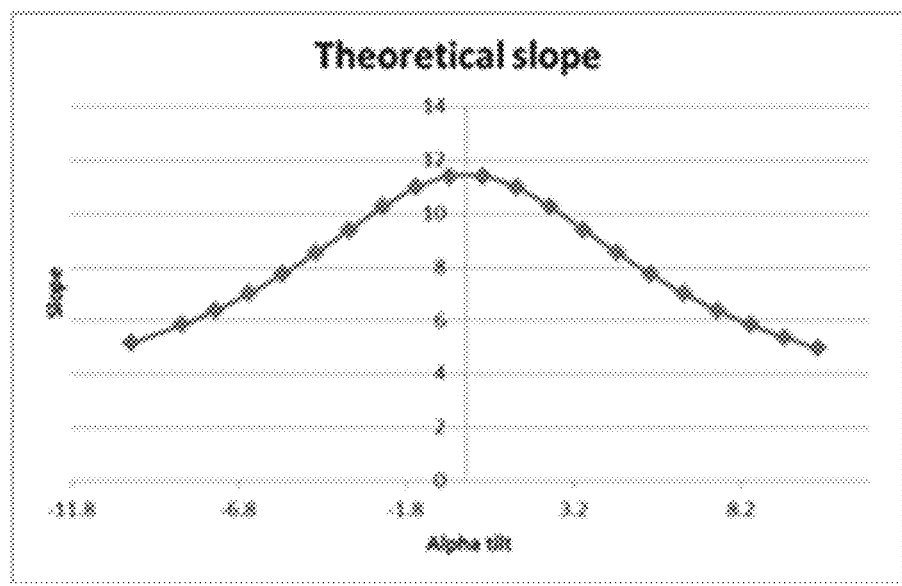
FIGS. 10A and 10B depict graphs of theoretical slopes based on initial beta mis-tilt.
Figure 10B:
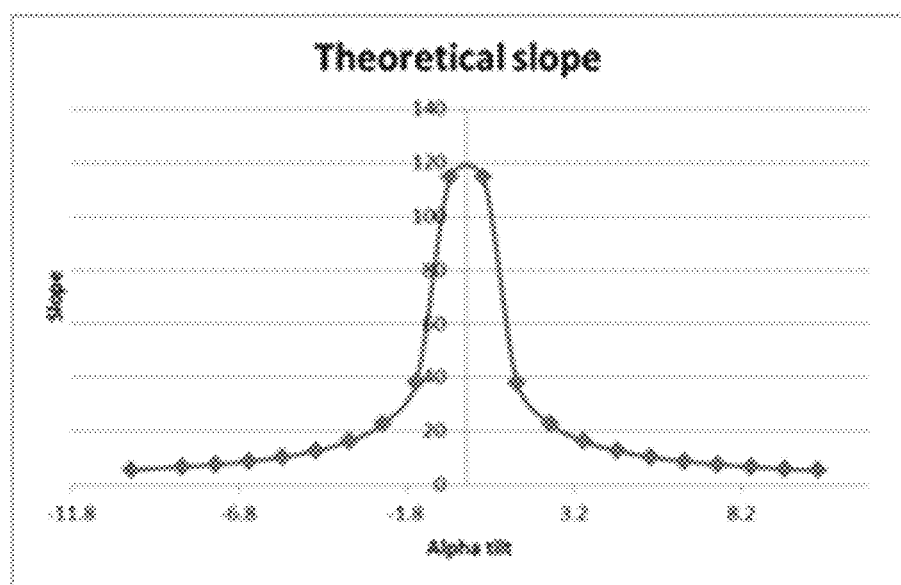

If a plot of Equation 14 is plotted then it equal to a cross section of FIG. 9; hence explaining the origins of the power spectra smearing phenomenon. What's more, rather than using the power spectra the same effect can be seen in real space measuring the edges around the disk and finding the direction of maximum slope. Moreover, false positives could be removed by ensuring the slopes follow Equation 13 or 6.

Conclusions

Figure 11A:
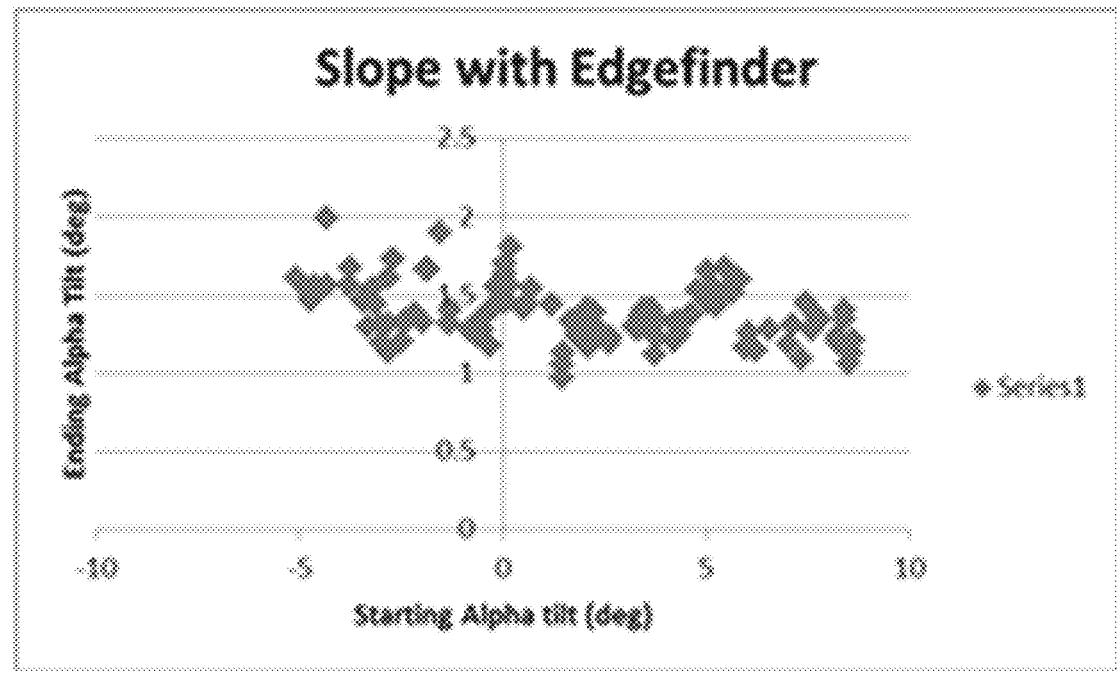
FIGS. 11A and 11B depict an AAL run on 70 μm Si lamella with 0 beta mis-tilt. A 60% improvement was observed over the illustrating the utility of this method.
Figure 11B:
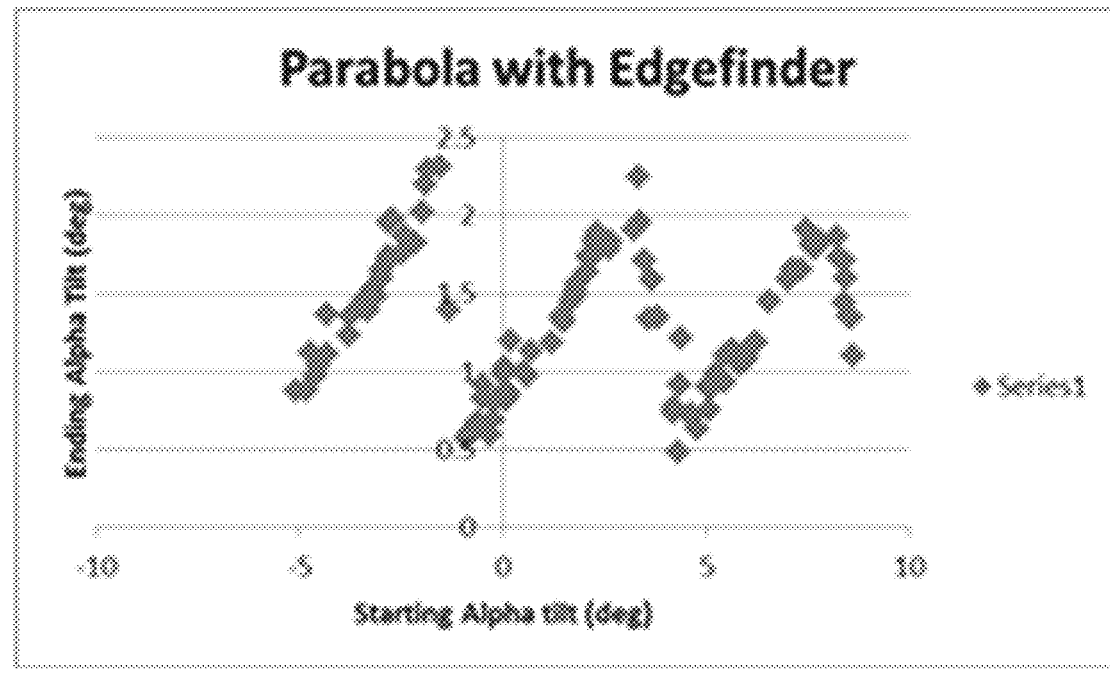

An improved model for interpolating the slope vs stage tilt data has been discussed. The theoretical curves are similar to the actual curves, but there are some differences; to be expected. The model does not consider profile filtering, rough non-planar edges, etc . . . . In general the specimen will not be a parallelepiped rectangle with flat edges. The estimated slope will not be the actual slope; it will be modified by a transfer function. All of this is beyond the scope of this modeling exercise; hence expect some sawtooth type behavior even in the improved model, but better than parabola fitting. FIGS. 11A and 11B shows AAL run on 70 μm Si lamella with 0 beta mis-tilt. A 60% improvement was observed over the parabola interpolation scheme illustrating the utility of this method.

What is claimed:

1. A method for aligning a sample in a microscopy system, comprising:
   rotating the sample along a first axis by each of a plurality of rotation angles,
   imaging, with a charged particle beam, the sample for each rotation angle;
   determining a first rotation angle based on the image for each rotation angle, wherein the first rotation angle aligns the sample to the charged particle beam in relation to the first axis; and
   determining a second rotation angle based on the first rotation angle, wherein the second rotation angle aligns the sample to the charged particle beam in relation to a second axis, and wherein the second axis is orthogonal to the first axis.

2. The method according to claim 1, wherein determining the first rotation angle comprises:
calculating a power spectrum of the image for each rotation angle; and
determining an orientation of the power spectrum for each rotation angle.

3. The method according to claim 2, wherein the determining the orientation of the power spectrum for each rotation angle is further based on a principal component decomposition of the power spectrum.

4. The method according to claim 1, wherein determining the first rotation angle comprises:
calculating a power spectrum of the image for each rotation angle; and
determining an anisotropy of the power spectrum for each rotation angle.

5. The method according to claim 1, wherein the determining the first rotation angle is according to:

$$\theta_{maxSlope} = \operatorname{atan}\left(\frac{\sin(\beta - \beta_{stage})\cos(\alpha - \alpha_{stage})}{\sin(\alpha - \alpha_{stage})}\right),$$

wherein $\beta - \beta_{stage}$ comprises the second rotation angle, $\alpha - \alpha_{stage}$ comprises a rotation angle of the plurality of rotation angles, and $\theta_{maxSlope}$ comprises a maximum slope of a power spectrum for a corresponding image of the sample.

6. The method according to claim 1, wherein the sample comprises a base and at least one cell arranged on the base, and wherein the method further comprises segmenting the image of the sample to extract images of the at least one cell.

7. The method according to claim 6, wherein the segmentation of the image is, at least in part, carried out by a machine learning algorithm.

8. The method according to claim 6, wherein determining the first rotation angle comprises:
calculating a power spectrum of the image for each rotation angle; and
determining an orientation of the power spectrum for each rotation angle, wherein the power spectrum of the image for each rotation angle comprises a power spectrum over a region comprising the at least one cell.

9. The method according to claim 1, wherein determining the first rotation angle comprises:
calculating a power spectrum of the image for each rotation angle; and
determining an orientation of the power spectrum for each rotation angle, and wherein the second rotation angle is determined based on the orientation of the power spectrum.

10. The method according to claim 9, wherein the method further comprises:
selecting a plurality of principal components of the power spectrum to determine an orientation of the power spectrum, the plurality of principal components comprising a component having a largest eigenvalue and a component having a second largest eigenvalue, wherein the orientation of the power spectrum is determined based on a ratio of the largest eigenvalue to the second largest eigenvalue.

11. The method of claim 1, wherein the first axis corresponds to a length or a width of the sample.

12. The method of claim 1, further comprising positioning the sample according to the first rotation angle.

13. The method of claim 1, wherein rotating the sample along the first axis comprises a sweep along the first axis.

14. The method of claim 1, wherein the first rotation angle corresponds to a second axis of the sample that is orthogonal to the first axis.

15. A microscopy system comprising:
a charged particle beam;
a sample; and
a controller configured to:
rotate the sample along a first axis by each of a plurality of rotation angles;
image, with the charged particle beam, the sample for the each of the plurality of rotation angles;
determine a first rotation angle based on the image for the each of the plurality of rotation angles, wherein the first rotation angle aligns the sample to the charged particle beam in relation to the first axis; and
determine a second rotation angle based on the first rotation angle, wherein the second rotation angle aligns the sample to the charged particle beam in relation to a second axis, and wherein the second axis is orthogonal to the first axis.

16. The microscopy system according to claim 15, wherein determining the first rotation angle comprises:
calculating a power spectrum of the image for each rotation angle; and
determining an anisotropy of the power spectrum for each rotation angle.

17. The microscopy system according to claim 15, wherein determining the first rotation angle comprises:
calculating a power spectrum of the image for each rotation angle; and
determining an orientation of the power spectrum for each rotation angle.

18. The microscopy system according to claim 15, wherein the controller is further configured to control a tilt of the sample.

19. The microscopy system according to claim 18, further comprising a data processing unit configured to at least send data to the controller, the data comprising a plurality of rotation angles corresponding to a rotation about the first axis.

20. A non-transitory computer program product comprising instructions that, when executed cause a processor to perform the method according to claim 1.

* * * * *